United States Patent [19]
Ikata et al.

[11] Patent Number: 5,561,406
[45] Date of Patent: Oct. 1, 1996

[54] DUPLEXER PACKAGE

[75] Inventors: Osamu Ikata; Yoshio Satoh; Nobuo Hirasawa; Hideki Ohmori, all of Kawasaki, Japan

[73] Assignee: Fujitsu Limited, Kawasaki, Japan

[21] Appl. No.: 412,318

[22] Filed: Mar. 29, 1995

[30]      Foreign Application Priority Data

Jul. 1, 1994   [JP]   Japan ..................................... 6-151319

[51] Int. Cl.⁶ ...................................................... H01P 5/12
[52] U.S. Cl. .......................... 333/126; 333/128; 333/185; 333/129; 333/193; 333/133
[58] Field of Search ................................... 333/126, 127, 333/128, 132, 133, 193–196, 185

[56]             References Cited

U.S. PATENT DOCUMENTS 5,015,973   5/1991  Kawakami et al. ..................... 333/132
  5,103,197   4/1992  Turunen et al. ........................ 333/206
  5,323,127   6/1994  Komazaki et al. ..................... 333/126

FOREIGN PATENT DOCUMENTS

2-20111    1/1990  Japan .
  2-29109    1/1990  Japan .
  2-69012    8/1990  Japan .
  5-167389   7/1993  Japan .
  5-167388   7/1993  Japan .

*Primary Examiner*—Benny Lee
*Assistant Examiner*—Darius Gambino
*Attorney, Agent, or Firm*—Armstrong, Westerman, Hattori, McLeland & Naughton

[57]            ABSTRACT

A multilayer duplexer package is provided, which includes: two surface-acoustic-wave filter chips having different center pass band frequencies; and at least two phase matching circuits for matching the phase of one filter chip to that of the other filter chip, said phase matching circuits respectively comprising strip lines stacked one above another, and said strip lines each having a characteristic impedance higher than the characteristic impedance of an external circuit to be connected to the duplexer package.

9 Claims, 10 Drawing Sheets

DUPLEXER PACKAGE

BACKGROUND OF THE INVENTION

1. Field of the Invention

The present invention relates to duplexer packages employing a surface-acoustic-wave band pass filter and, more particularly, to multilayer duplexer packages having phase matching circuits.

2. Description of the Related Art

In recent years, mobile communications apparatuses such as handy phones have been rapidly down-sized and, hence, the parts for use therein have been desired to have a reduced size and higher performance. In radio communications apparatuses, duplexers are used to prevent the interference of transmitted and received signals. While most of the duplexers comprise band pass filters or band filters utilizing dielectric or combinations thereof, those employing surface-acoustic-wave filters are now under research and development.

A duplexer comprising two surface-acoustic-wave band pass filter chips F1 and F2 should be designed so as to prevent the interference between the filter characteristics of these surface-acoustic-wave band pass filters. To this end, the surface-acoustic-wave band pass filters are each provided with a phase matching circuit.

In general, the aforesaid filter chips F1 and F2 are designed to each have an impedance close to a characteristic impedance (typically 50 Ω) of the entire filter circuit around the center band pass frequency thereof, and have an impedance much higher than the characteristic impedance in frequency ranges out of the pass band. However, it is difficult to prevent one filter chip from interfering with the filtering characteristics of the other filter chip in a pass band thereof due to the influence of resistance present in the circuit pattern. For this reason, the phase matching circuit is needed. The constant of the phase matching circuit is determined by respective center band pass frequencies f1 and f2 of these two filter chips and the difference therebetween.

Conventionally proposed phase matching circuits employ L (inductance) element and C (capacitor) element or lines serving as L and C components.

For example, Japanese Unexamined Patent Publications HEI 5(1993)-167388 and HEI 5(1993)-167389 disclose duplexers having phase matching circuits formed of metal strip lines on a glass-epoxy resin substrate or ceramic substrate. Otherwise, there is known a duplexer package comprising a multilayer ceramic package having two filter chips and phase matching circuits accommodated therein.

Figure 10A:
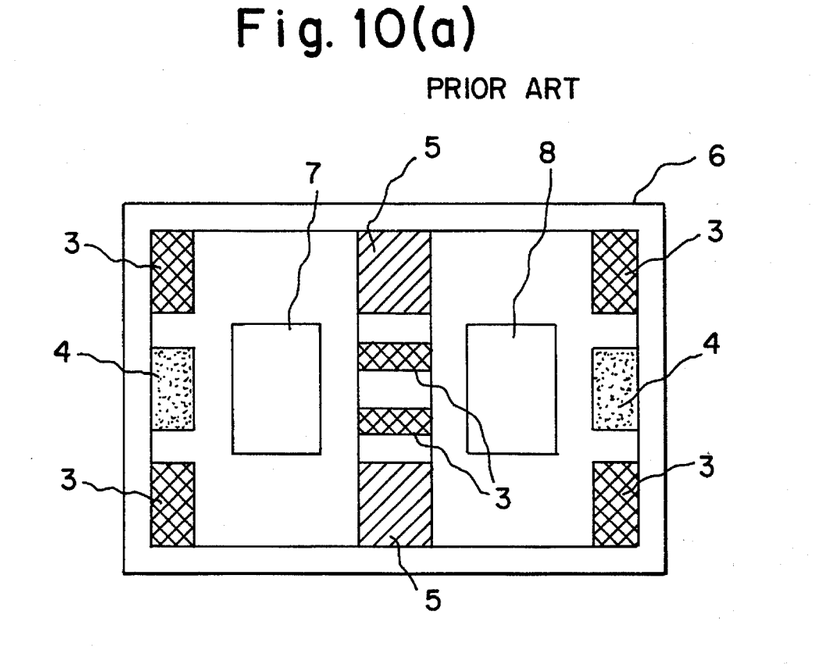
FIGS. 10(a) and 10(b) are a plan view and sectional view, respectively, of a conventional duplexer package.
Figure 10B:
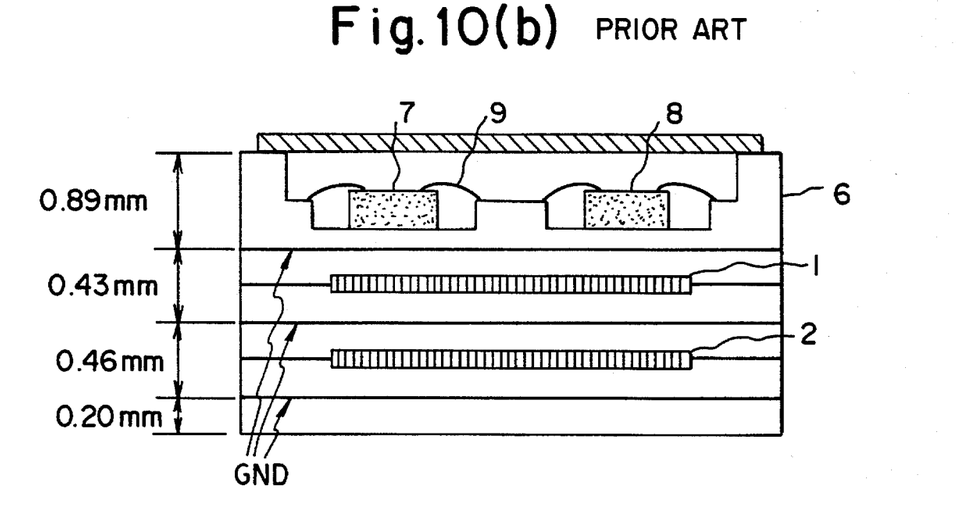

In FIGS. 10(a) and 10(b), there is shown one example of a conventional duplexer comprising this type of multilayer ceramic package. The duplexer shown includes filter chips 7 and 8 mounted on a multilayer ceramic package 6 having a plurality of ground layers GND, phase matching circuits 1 and 2, ground terminals 3, filter signal terminals 4 and common signal terminals 5, wherein the filter chips 7 and 8 are each connected to the terminals 3, 4 and 5 by means of wires 9.

As shown, the phase matching circuits 1 and 2 are disposed below the filter chip layer and each is sandwiched between the GND layers in the package. The phase matching circuits 1 and 2 are typically formed of strip lines, and the characteristic impedances thereof are respectively adjusted equal to the characteristic impedance of an external circuit connected to the common signal terminals 5, so that the circuit loss can be reduced.

However, the characteristic impedances of these two filter chips having different center pass band frequencies in the duplexer vary depending on signal frequencies to be used. For example, the characteristic impedance of each of the filter chips is substantially the same as that of an external circuit connected thereto in a pass band, and is much lower or higher than that of the external circuit in a stop band. If these filter chips are to be used for the construction of a duplexer, an attempt must be made to prevent degradation in the characteristics of the filter chips and the external circuits for a reduced circuit loss. For this reason, it is ideal that the characteristic impedance of one filter chip is infinitely great and the reflection coefficient thereof is generally 1 in the pass band of the other filter chip.

To attain such ideal characteristics, phase matching circuits are required. To meet this requirement, the formation of the aforesaid strip lines has been proposed. In this case, the resistance increases proportionally to the strip line length. The increase in resistance may cause a signal transmission loss and increase in the distribution constant of stray capacity to occur. The increase in stray capacity influences the phase circuit constant and the like, and such influence increases as the frequency of signals to be used grows higher. That is, the branching characteristics of transmitted and received signals are degraded, resulting in a transmission loss of the signals.

If the package is made of a material having a high dielectric constant, the layers have to be bonded to each other at a high temperature. This means that the strip lines should be formed of a high melting-point metal. Therefore, the aforesaid filtering characteristics may be degraded to a larger extent.

SUMMARY OF THE INVENTION

In accordance with the present invention, there is provided a multilayer duplexer package comprising: two surface-acoustic-wave filter chips having different center pass band frequencies; and at least two phase matching circuits for matching the phase of one filter chip to that of the other filter chip, said phase matching circuits respectively comprising strip lines stacked one above another, and said strip lines each having a characteristic impedance higher than the characteristic impedance of an external circuit to be connected to the duplexer package.

With this construction, the impedance of each of the strip lines is set to a value higher than that of the external circuit to be connected to the duplexer package, whereby the signal loss in the pass band of the filter chip can be reduced and, hence, the characteristic degradation can be suppressed.

DESCRIPTION OF THE PREFERRED EMBODIMENTS

The present invention will now be described in detail.

A multilayer duplexer package in accordance with the present invention includes: two surface-acoustic-wave filter chips having different center band pass frequencies; and at least two phase matching circuits for matching the phase of one filter chip to that of the other filter chip, the phase matching circuits respectively comprising strip lines stacked one above another, and the strip lines each having a characteristic impedance higher than the characteristic impedance of an external circuit to be connected to the duplexer package.

The characteristic impedance of each strip line is preferably set to a value 1.11 (±7%) times that of the external circuit.

Further, the strip line may have different widths at the opposite ends thereof.

Preferably, the duplexer package further comprises a common signal terminal for connecting the external circuit thereto, wherein the strip lines are each connected to the common signal terminal at one end thereof and to the corresponding filter chip at the other end thereof, and wherein said one end of each strip line connected to the common signal terminal has a width narrower than that of said other end thereof connected to the filter chip, so that the width of the strip line gradually narrows from said other end connected to the fillter chip to said one end connected to the common signal terminal.

Further, the strip lines and filter chips are preferably formed in tiers.

Preferably, the filter chips each comprise parallel surface-acoustic-wave resonators connected in parallel to a signal line which links the common signal terminal and the corresponding strip line, and a serial surface-acoustic-wave resonator connected in series to the signal line, wherein the number of the ground terminals for duplexer package is greater than the number of the parallel surface-acoustic-wave resonators of the filter chips.

The duplexer package is typically made of alumina, glass ceramic or any other material having a high dielectric constant. Exemplary materials of the strip lines include gold, tungsten, copper and any other material having a low resistance and high conductivity. The two strip lines are sandwiched between layers of the package made of any of the aforesaid materials having a high dielectric constant, and stacked one above the other with a layer of the package being interposed therebetween.

In accordance with the present invention, the impedance of each of the strip lines is set to a value higher than that of the external circuit to be connected to the duplexer package, whereby the signal loss in a pass band of the filter chip can be reduced and, hence, the characteristic degradation can be suppressed.

In addition, the strip lines do not have a constant width, but different widths at the opposite ends thereof. More specifically, the width of one end of each strip line connected to the common signal terminal is narrower than that of the other end thereof connected to the filter chip, so that the width of the strip line gradually narrows from said other end connected to the filter chip to said one end connected to the common signal terminal. This allows the signal loss in the pass band of the filter chip to be reduced, thereby suppressing the characteristic degradation.

Further, the strip lines and filter chips are formed in tiers, thereby down-sizing the duplexer package.

Still further, the number of ground terminals for duplexer package is greater than the number of parallel surface-acoustic-wave resonators constituting the filter chips. Hence, the signal attenuation in stop bands of the respective filter chips can be increased, thereby suppressing the characteristic degradation.

With reference to the attached drawings, the present invention will hereinafter be specifically described by way of EMBODIMENTs, but not limited thereto.

EMBODIMENT 1

Figure 1:
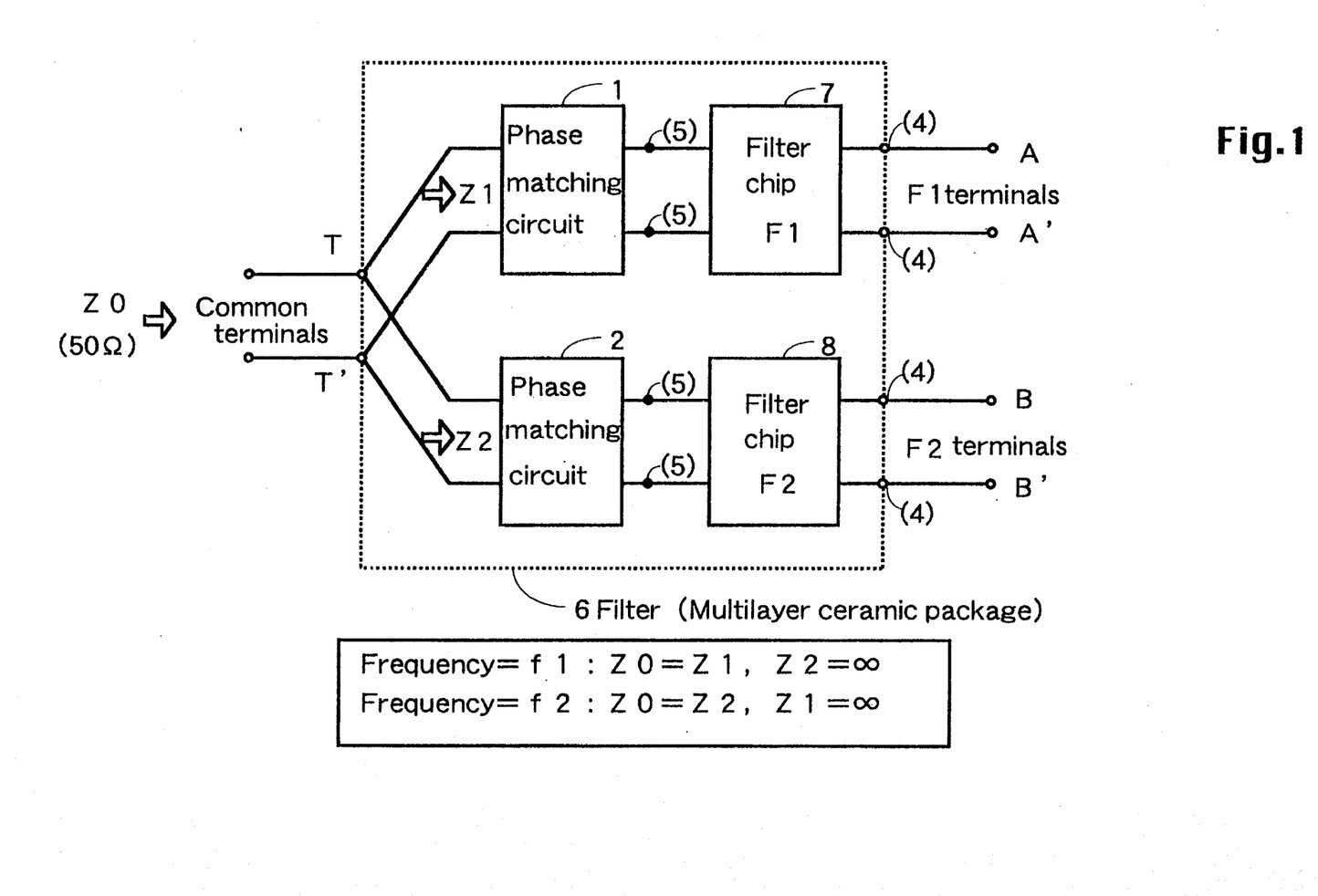
FIG. 1 is a block diagram of a duplexer in accordance with EMBODIMENT 1 of the present invention.

FIG. 1 is a schematic view of a duplexer in accordance with the present invention. As shown, the duplexer comprises two surface-acoustic-wave band pass filter chips F1 and F2 connected to common terminals T-T' and two phase matching circuits 1 and 2 respectively connected between the filter chips and common terminals T-T'.

The common terminals T and T' are connected to an external circuit for transmitting and receiving radio waves via an antenna. The duplexer further comprises F1 terminals connected to the filter chip F1 for connecting thereto, for example, an external transmitter circuit, and F2 terminals connected to the filter chip F2 for connecting thereto, for example, an external receiver circuit.

Figure 2:
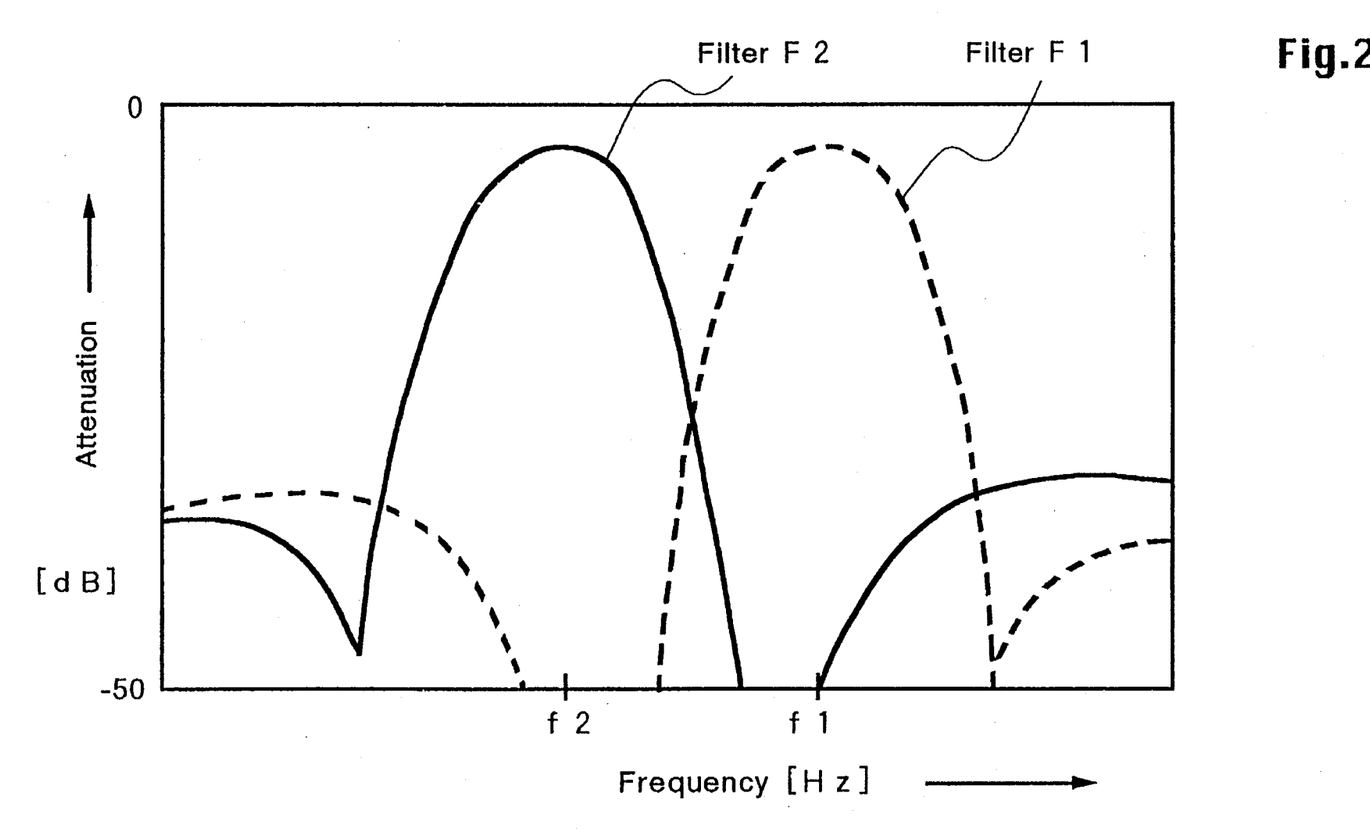
FIG. 2 is a graphical representation for the explanation of frequency characteristics of filter chips of a duplexer.

FIG. 2 is a graphical representation for the explanation of frequency characteristics of the filter chips of the duplexer. As shown, the surface-acoustic-wave band pass filter chips F1 and F2 have different center band pass frequencies. For example, the center frequencies f1 and f2 of the filter chips F1 and F2 are set to 932 MHz and 878 MHz, respectively. In this case, the filter chips F1 and F2 are each provided with a phase matching circuit so that the band pass characteristics of the filter chips do not interfere with each other, i.e., the minimum attenuation of the respective filter chips do not overlap with each other.

Figure 3A:
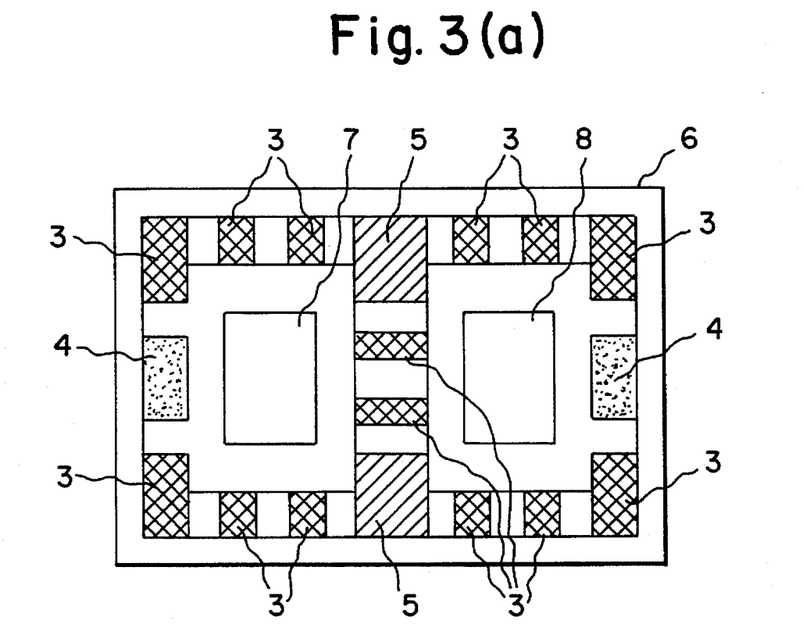
FIGS. 3(a) and 3(b) are a plan view and sectional view, respectively, of a duplexer employing a multilayer ceramic package in accordance with EMBODIMENT 1 of the present invention.
Figure 3B:
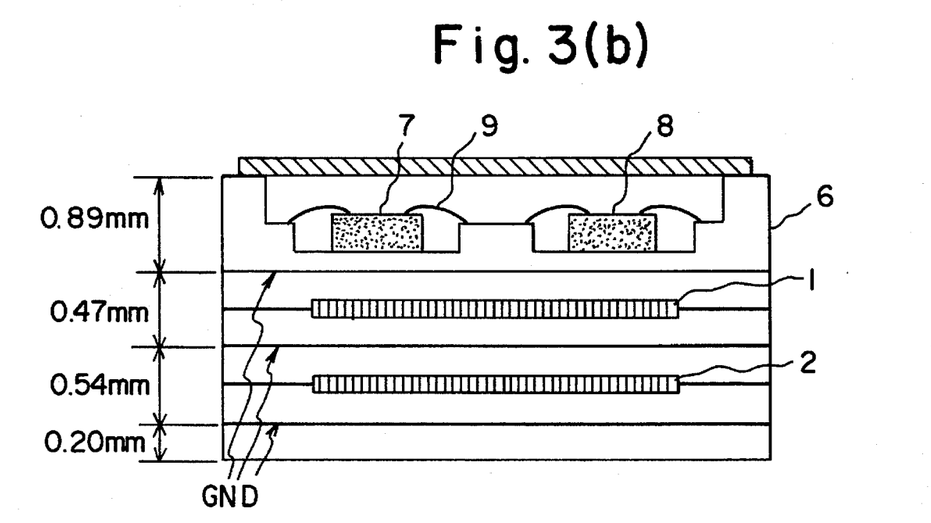

FIGS. 3(a) and 3(b) are a plan view and sectional view, respectively, of a duplexer employing a multilayer ceramic package in accordance with the present invention. In FIGS. 3(a) and 3(b), there are shown phase matching circuits 1 and 2 respectively comprising strip lines made of such a material as tungsten, ground layers GND stacked with the two strip lines being interposed therebetween, ground terminals 3 for duplexer package, filter signal terminals 4 respectively connected to filter chips 7 and 8 from transmitter and receiver circuits respectively, and common signal terminals 5 connected to an external circuit through the phase maching circuits.

The filter chips 7 and 8 are mounted above the ground layers. The filter chips 7 and 8 are each connected to the ground terminals 3, filter signal terminals 4 and common signal terminals 5 by means of wires 9. The strip lines 1 and 2, terminals 3, 4 and 5, and filter chips 7 and 8 formed in a layered structure are connected to each other via through-holes.

A ceramic package 6 having the aforesaid structure is made of a glass ceramic material (dielectric constant=5) and has dimensions of about 7.5 mm×8.5 mm×2.1 mm (height).

Figure 4:
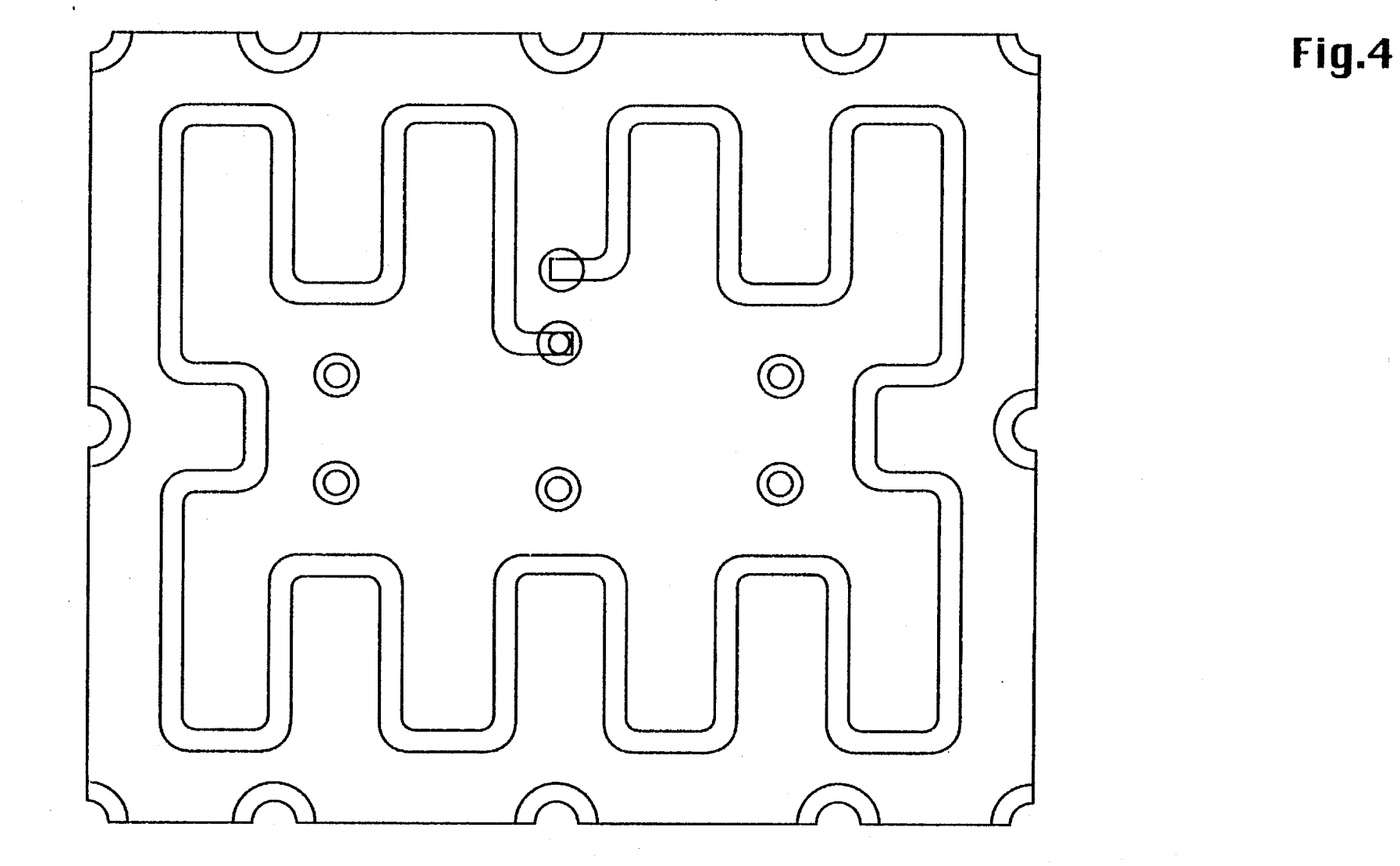
FIG. 4 is a plan view illustrating an exemplary pattern of a strip line in accordance with the present invention.

The strip lines 1 and 2 embedded between the ground layers GND are not of a straight line configuration, but are continuous lines having some curves and straight lines formed on the same plane. FIG. 4 is a plan view illustrating an exemplary pattern of the strip line 1. The length and width of the strip line 1 are about 35 mm and about 0.2 mm, respectively. The strip line 2 has a configuration different from that of the strip line 1, and the length and width thereof are about 25 mm (shorter than the strip 1) and 0.2 mm (same as the strip 1), respectively.

These two strip lines are each disposed between the ground layers GND made of a glass ceramic material, as shown in FIG. 3(b). The thicknesses of the respective ground layers are as shown in FIG. 3(b) so as to adjust the characteristic impedances of the respective strip line patterns to 55Ω. In this case, the characteristic impedances of the strip lines are set higher (=55Ω) than the characteristic impedance (=50Ω) of the external circuit.

Figure 5:
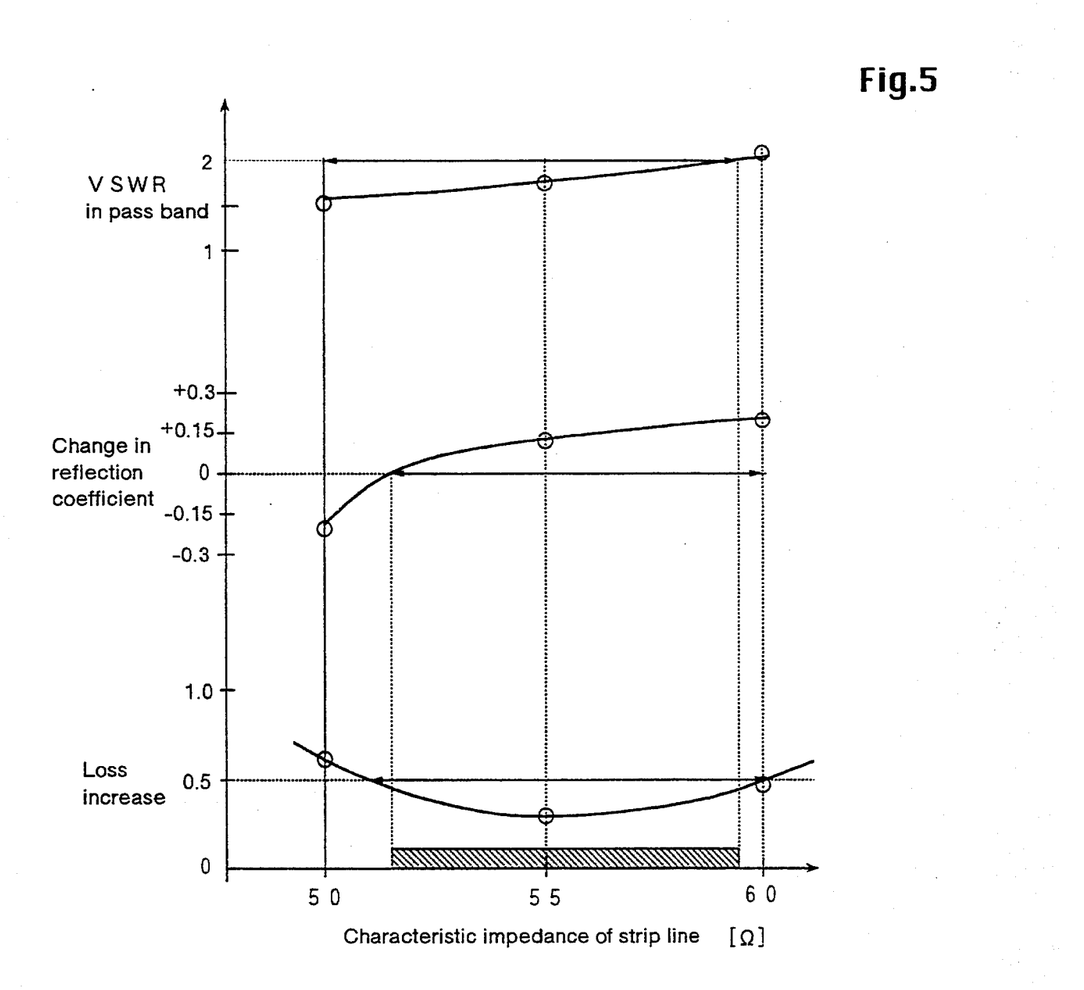
FIG. 5 is a graphical representation showing a change in the filter characteristics relative to the characteristic impedance of a strip line in accordance with the present invention.

FIG. 5 is a graphical representation showing the change in the filter characteristics relative to the characteristic impedance of the strip line. The filter characteristics shown in FIG. 5 include a voltage standing wave ratio (VSWR) in a pass band of one filter chip, reflection coefficient change, and loss increase in a pass band of the other filter chip, which are all plotted as the ordinate.

The VSWR in the pass band is generally not greater than 2 and ideally 1. Therefore, the filter has a VSWR of not greater than 2 and as close to 1 as possible.

Though the reflection coefficient is ideally 1, a generally employed filter has a reflection coefficient of about 0.85 to about 0.90. To prevent the characteristic degradation of the filter, it is essential that the change value of the reflection coefficient is such that the reflection coefficient is as close to 1 as possible, i.e., a value not less than 0.

The loss increases or decreases with the change in the characteristic impedance of the strip line. The permissible range of loss increase is 0 to about 0.5, which causes no problem in practical signal transmission.

As can be understood from FIG. 5, where the characteristic impedance is 50Ω, for example, the VSWR assumes a more preferable value than the case where the characteristic impedance is 55Ω). However, the values of the reflection coefficient change and loss increase assume undesirable values.

Accordingly, the strip lines having a characteristic impedance of 55Ω) exhibit less degradation in the filter characteristics as a whole than those having a characteristic impedance of 50Ω. This means that the characteristic degradation is more suppressed where the strip lines have a characteristic impedance somewhat higher than that of the external circuit. Further, where the strip lines have a characteristic impedance close to 60Ω, the VSWR assumes a value greater than 2, and an increase in mismatching loss exceeds 0.5, causing degradation in filter characteristics that cannot be ignored.

The criteria for selecting the characteristic impedance of the strip lines that do not pose practically any problems are such that the VSWR is not greater than 2, the reflection coefficient change is not less than 0 and the loss increase is not greater than 0.5. To suppress the degradation in the filter characteristics without causing any problems in practical signal transmission, the characteristic impedance of the strip lines should be 1.11 (±7%) times the characteristic impedance (50Ω) of the external circuit (i.e., 51.615Ω to 59.385Ω).

The upper limit of the characteristic impedance of the strip lines is such that the VSWR is about 2, and the lower limit thereof is such that the reflection coefficient change is 0. When the characteristic impedance is 1.11 (±7%) times the characteristic impedance (50Ω) of the external circuit, the range between the upper and lower limits of the characteristic impedance can be realized.

Thus, the signal loss in the pass bands of the respective filter chips can be reduced for suppressing the characteristic degradation of the filter chips by setting the characteristic impedance of the strip lines (or the phase matching circuits) to a value higher than that of the external circuit.

Furthermore, since two strip lines are stacked one above the other and the filter chips are disposed above the strip lines, the entire size of the duplexer package can be reduced. As previously mentioned, the characteristic degradation of the filter chips can be suppressed and, hence, the production yield of duplexer packages can be improved.

EMBODIMENT 2

To be next described is an example of a duplexer including strip lines each having different widths at the opposite ends thereof.

The width of the strip line pattern (shown in FIG. 4) embedded between ground layers is gradually changed. For example, the strip line 1 has gradually narrowing widths along the longitudinal direction thereof with a width of about 240 μm at one end thereof connected to the filter chip, a width of about 180 μm at the other end thereof connected to the common terminal, and a width of about 200 μm at the intermediate portion thereof.

Figure 6:
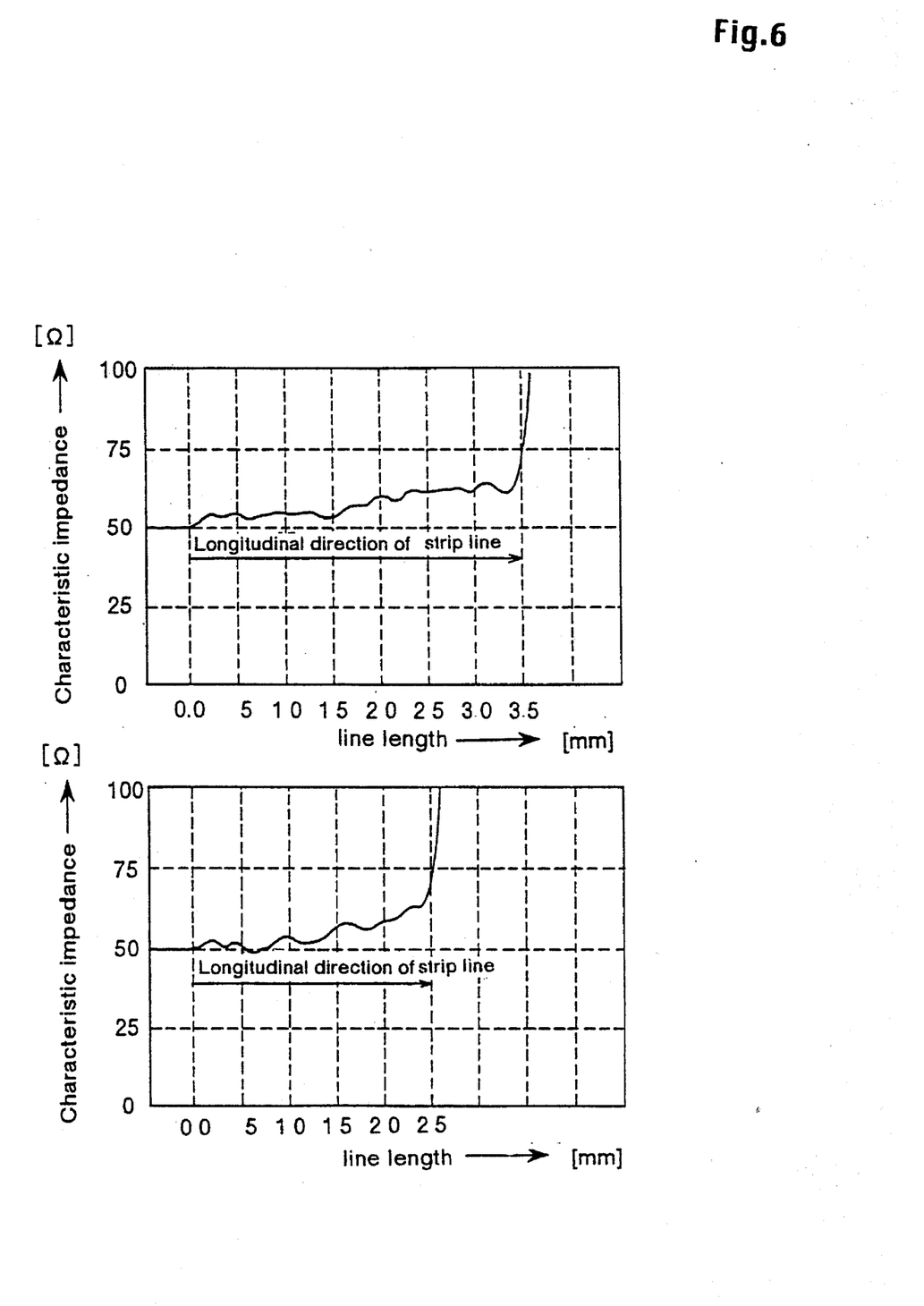
FIG. 6 is a graphical representation showing a change in the characteristic impedance of a strip line in accordance with EMBODIMENT 2 of the present invention.

FIG. 6 is a graphical representation showing a change in the characteristic impedance of a strip line having gradually changing widths along the longitudinal direction thereof. The characteristic impedance includes an influence by the resistance of the strip line.

In FIG. 6, the abscissa and the ordinate show the length and the characteristic impedance, respectively, of the strip line. The upper graph in FIG. 6 shows the case where the line length is 35 mm (corresponding to the strip line 1 ), and the lower graph in FIG. 6 shows the case where the line length is 25 mm (corresponding to the strip line 2 ).

The left-hand side of the graph represents one end of the strip line on the filter chip side having a wider width, while the right-hand side of the graph represents the other end on the common terminal side having a narrower width. As can be understood from FIG. 6, where the characteristic impedance of the external circuit is rated at 50Ω), the characteristic impedance of the strip line is about 0.95 times at one end thereof on the filter chip side having a wider width and is 1.3 times at the other end thereof on the common terminal side having a narrower width, and the average impedance is 1.11 times that of the external circuit.

Figure 7:
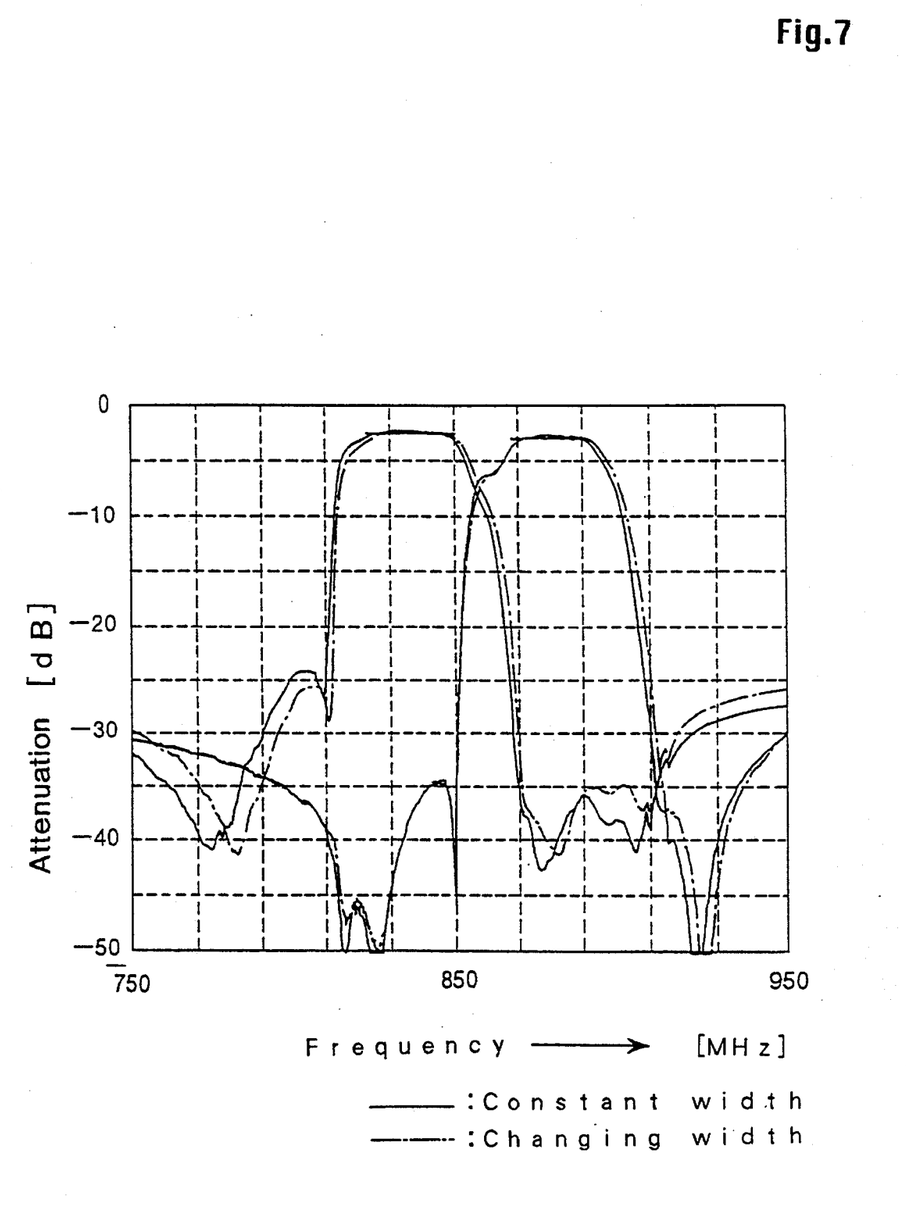
FIG. 7 is a graphical representation showing a comparison of band characteristics between EMBODIMENTs 1 and 2.

FIG. 7 is a graphical representation showing a comparison in band characteristics between the strip line of EMBODIMENT 1 having a constant width and the strip line of EMBODIMENT 1 having gradually changing widths. The abscissa and the ordinate show the frequency and attenuation, respectively.

As can be understood from FIG. 7, the strip line having gradually changing widths offers an improved insertion loss (Attenuation) and a mismatching loss of about 0.20 dB, which is reduced by 80% compared with the strip line of EMBODIMENT 1 having a constant width. The actual mismatching loss is smaller than a theoretical value. This is because, as a result of the phase rotation caused by the strip line, the characteristic impedance of the filter chip becomes equal to that of the external circuit which has a characteristic impedance quite different from that of the strip line.

Thus, the strip line having different widths at the opposite ends thereof allows the filter chip to exhibit a reduced signal loss in the pass band thereof and less characteristic degradation. In addition, the suppression of the characteristic degradation improves the production yield of duplexer packages.

EMBODIMENT 3

EMBODIMENT 1 shown in FIG. 3 provides an example of a duplexer package having a plurality of ground terminals formed on the surface thereof. By way of EMBODIMENT 3, there will be described the characteristics of a duplexer package having ground terminals or ground bonding pads, the number of which is greater than that of the parallel surface-acoustic-wave resonators incorporated in the filter chip.

In general, the filter chip includes parallel surface-acoustic-wave resonators connected in parallel to a signal line which links the aforesaid common terminal and a strip line, and a serial surface-acoustic-wave resonator connected in series to the signal line.

As described with reference to FIG. 3(a), one end of each of the resonators in the filter chip is connected to a ground terminal 3, filter terminal 4 and common terminal 5 by means of wires 9. As the duplexer is of multilayer structure, the connection to the strip lines disposed in lower layers and grounding are achieved by through-holes.

Figure 8:
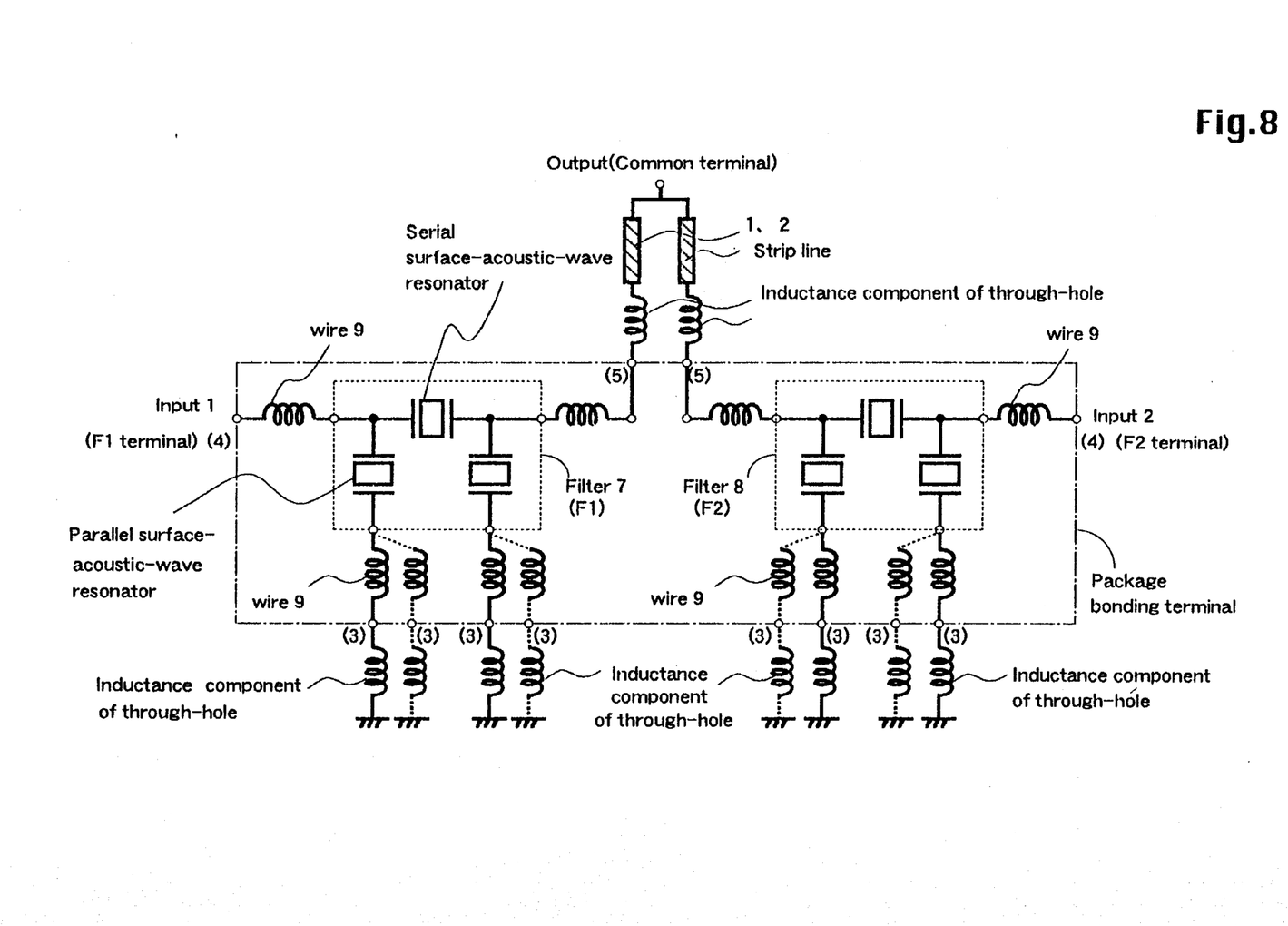
FIG. 8 is an electrically equivalent circuit model of a duplexer package in accordance with the present invention.

FIG. 8 is an electrically equivalent circuit model of the duplexer package shown in FIG. 3. In FIG. 8, there are shown filter chips 7 and 8 each comprising a serial surface-acoustic-wave resonator and two parallel surface-acoustic-wave resonators. The filter chips are connected to the respective terminals by means of wires 9. The wires 9 each include an inductance component. The through-holes for connecting the filter chips to the strip lines disposed in the lower layers and ground terminals also include inductance components as shown in FIG. 8.

It is known that the signal attenuation in the stop band of a filter is changed as the number of wires connected to the parallel surface-acoustic-wave resonators changes. This is because the inductance components present in the wires 9 and through-holes are changed. In general, the inductance components cause the leakage of high-frequency signals and adversely affect the signal attenuation. Therefore, the inductance components should be reduced.

For this reason, ground terminals 3 greater in number than the parallel surface-acoustic-wave resonators are formed on the duplexer package. Therefore, an increased number of the wires 9 and through-holes are used for connecting the filter to the ground terminals in parallel and, hence, the inductance components included in the wires 9 and through-holes can be reduced.

Figure 9:
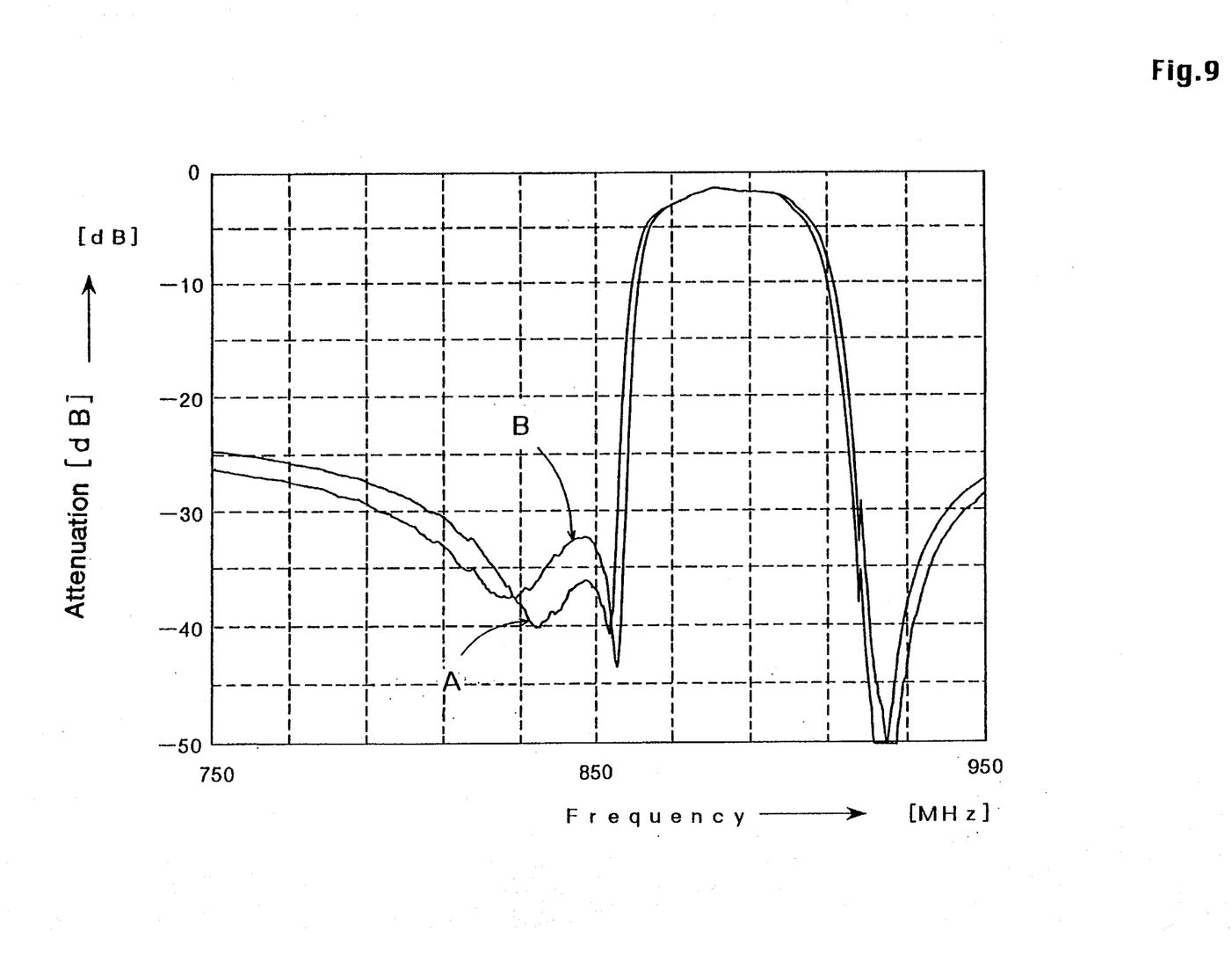
FIG. 9 is a graphical representation showing a band characteristic in accordance with EMBODIMENT 3 of the present invention.

FIG. 9 is a graphical representation of band pass characteristics for comparison between case (A) where an increased number of ground terminals are formed and case (B) where the number of parallel surface-acoustic-wave resonators is equal to that of the ground terminals. In the case (A), there are provided two ground terminals per parallel surface-acoustic-wave resonator. The attenuation in the stop band of the filter chip can be increased by about 5 dB as shown in FIG. 9. At this time, little characteristic degradation is observed in the pass band of the filter chip as shown in FIG. 9.

Instead of increasing the number of ground terminals as described above, the signal attenuation in the stop band can be increased by increasing the number of wires for connecting the ground terminals to the filter. It is considered that the reduction in the signal attenuation in the stop band results from reduced inductance components present in the through-holes and wires.

As can be appreciated from the foregoing, the filter characteristics can be improved by providing as many ground terminals 3 as shown in FIG. 8 as the space of the duplexer package permits. Thus, by providing ground terminals greater in number than the parallel surface-acoustic-wave resonators, the signal attenuation can be increased only in the stop band without degrading the characteristics in the pass band of the filter chip. This means that the characteristics of one filter chip can be improved in the pass band of the other filter chip.

Although these embodiments employ duplexer packages made of glass ceramic, other materials such as alumina (dielectric constant: 10) and mulite may be used for the duplexer package. These materials also improve the filter characteristics to substantially the same extent as glass ceramic with little difference in the absolute value of signal attenuation.

While the duplexer packages in accordance with the aforesaid embodiments are of layered structure with filter chip layer and two strip line layers being stacked in tiers, the filter chips and two strip lines may be arranged in the same plane of one glass ceramic substrate. In such case, a substrate having a larger base area may be required, but the height thereof can be reduced. Therefore, either the duplexer of the stacked structure or the duplexer of the planar structure having filter chips etc. arranged in the same plane can be chosen, depending on applications thereof.

Alternatively, the duplexer may be of such a construction that the strip lines and the filter chips are arranged on independent substrates, or that two strip lines are embedded parallel to each other in a glass ceramic substrate.

In accordance with the present invention, the characteristic degradation of filter chips can be suppressed by setting the characteristic impedance of each strip line to a value greater than the characteristic impedance of an external circuit connected to the duplexer package, by forming strip lines each having different widths at the opposite ends thereof, or by providing the duplexer package with ground terminals greater in number than the parallel surface-acoustic-wave resonators incorporated in the filter chips.

What is claimed is:

1. A multilayer duplexer package comprising:

two surface-acoustic-wave filter chips having different center pass band frequencies; and at least two phase matching circuits for matching the phase of one filter chip to that of the other filter chip, said phase matching circuits respectively comprising strip lines stacked one above another, and said strip lines each having a characteristic impedance higher than the characteristic impedance of an external circuit to be connected to the duplexer package.

2. A duplexer package as set forth in claim 1, wherein the characteristic impedance of each of said strip lines is set to a value 1.11 (±7%) times that of said external circuit.

3. A duplexer package as set forth in claim 1, wherein said strip lines each have different widths at opposite ends thereof.

4. A duplexer package as set forth in claim 1, wherein the characteristic impedance of each of said strip lines is set to a value 1.11 (±7%) times that of said external circuit, and said strip lines each have different widths at opposite ends thereof.

5. A duplexer package as set forth in claim 1, 2, 3 or 4, wherein said strip lines and said filter chips are formed in tiers.

6. A duplexer package as set forth in claim 1, wherein said strip lines each have different widths at opposite ends thereof, further comprising:

a common signal terminal for connecting the external circuit thereto, and said strip lines are each connected to the common signal terminal at one end thereof and to the corresponding filter chip at the other end thereof; and said one end of each of said strip lines connected to the common signal terminal has a width narrower than that of said other end thereof connected to the filter chip, so that the width of said each strip line gradually narrows from said other end connected to the filter chip to said one end connected to the common signal terminal.

7. A duplexer package as set forth in claim 6, wherein said strip lines and said filter chips are formed in tiers.

8. A duplexer package as set forth in claim 1 or 2, wherein said filter chips each comprise parallel surface-acoustic-wave resonators connected in parallel to a signal line which links the common signal terminal and one of the strip lines, and a serial surface-acoustic-wave resonator connected in series to said signal line, wherein the number of the ground terminals for duplexer package is greater than that of parallel surface-acoustic-wave resonators of the filter chips.

9. A duplexer package as set forth in claim 8, wherein said parallel surface-acoustic-wave resonators each have at least two ground terminals.

\* \* \* \* \*